United States Patent
Shu et al.

(10) Patent No.: US 10,510,541 B1
(45) Date of Patent: Dec. 17, 2019

(54) ANGULAR CONTROL OF ION BEAM FOR VERTICAL SURFACE TREATMENT

(71) Applicant: Varian Semiconductor Equipment Associates, Inc., Gloucester, MA (US)

(72) Inventors: Gang Shu, Rockport, MA (US); Glen Gilchrist, Danvers, MA (US); Shurong Liang, Poughkeepsie, NY (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 16/107,275

(22) Filed: Aug. 21, 2018

(51) Int. Cl.
| | |
|---|---|
| *H01L 21/265* | (2006.01) |
| *H01J 37/317* | (2006.01) |
| *H01J 37/305* | (2006.01) |

(52) U.S. Cl.
CPC ........ *H01L 21/265* (2013.01); *H01J 37/3053* (2013.01); *H01J 37/3171* (2013.01); *H01J 2237/30483* (2013.01)

(58) Field of Classification Search
CPC . H01L 21/265; H01J 37/3053; H01J 37/3171; H01J 2237/30483
See application file for complete search history.

(56) References Cited

U.S. PATENT DOCUMENTS

| | | | | |
|---|---|---|---|---|
| 3,688,203 | A * | 8/1972 | Harrison | H01J 37/3171 250/398 |
| 9,118,001 | B2 | 8/2015 | Godet et al. | |
| 9,659,942 | B1 * | 5/2017 | Basker | H01L 27/1104 |
| 2001/0015871 | A1 * | 8/2001 | Niwa | G11B 5/3109 360/122 |
| 2006/0194381 | A1 * | 8/2006 | Wei | H01L 21/26586 438/197 |
| 2010/0084581 | A1 * | 4/2010 | Benveniste | H01J 37/1472 250/492.21 |
| 2017/0178911 | A1 * | 6/2017 | Ma | H01L 21/26586 |
| 2017/0179133 | A1 * | 6/2017 | Ruffell | H01L 29/66803 |
| 2018/0204719 | A1 | 7/2018 | Ma et al. | |

* cited by examiner

*Primary Examiner* — Yasser A Abdelaziez (57) ABSTRACT

Provided herein are techniques for treating vertical surface features of a semiconductor device with ions. In some embodiments, a method for forming a semiconductor device, may include providing a set of surface features extending from a substrate, the set of surface features including a sidewall. The method may include treating the sidewall with an ion beam disposed at an angle, the angle being a non-zero angle of inclination with respect to a perpendicular to a plane of an upper surface of the substrate. The method may further include rotating the substrate about the perpendicular to the plane while the sidewall is treated with the ion beam to impact an entire height of the sidewall with the ion beam.

20 Claims, 8 Drawing Sheets

ANGULAR CONTROL OF ION BEAM FOR VERTICAL SURFACE TREATMENT

FIELD OF THE DISCLOSURE

The present embodiments relate to semiconductor device surface treatments, and more particularly, to techniques for treating vertical surface features of a semiconductor device with ions.

BACKGROUND OF THE DISCLOSURE

Integrated circuits are often formed on a semiconductor substrate, such as a silicon wafer or other semiconductive material. In general, various materials such as semiconductive, conductive, or electrically insulative materials, are used to form integrated circuits. By way of example, the various materials may be doped, ion implanted, deposited, etched, grown, etc., using various processes. A continuing goal in semiconductor processing is to reduce the size of individual electronic components, thus enabling smaller and denser integrated circuitry.

Fabrication of advanced 3-D semiconductor structures with complex surface topology and high packing density is populated with complex technical challenges. For example, many challenges exist for metal and dielectric etching, including directed reactive ion etching (DRIE) with high selectivity. One common characteristic of these processes is treatment of vertical surfaces with angled ion beams. Depending on the device structure, especially high aspect ratio structures, difficulty can be experienced in obtaining a uniform ion flux from top to bottom across the entire vertical sidewall. This problem occurs especially where the device aspect ratio causes shadowing of the ion beam, thus attenuating or blocking the ion flux to the lower portions of the vertical device features.

In some current art approaches, the above issues are mitigated by using multiple recipe steps along with decreasing ion beam angle. For example, ion beam angles may be modulated by tuning extraction voltage, source power and z-gap. Returning to the set-up process multiple times to create different ion beam angles is time consuming and reduces throughput in high volume manufacturing (HVM) processes.

SUMMARY OF THE DISCLOSURE

This Summary is provided to introduce a selection of concepts in a simplified form. This Summary is not intended to identify key features or essential features of the claimed subject matter, nor intended as an aid in determining the scope of the claimed subject matter.

In an example embodiment, a method for forming a semiconductor device includes providing a set of surface features extending from a substrate, each of the set of surface features including a sidewall. The method further includes treating the sidewall with an ion beam disposed at an angle, the angle being a non-zero angle of inclination with respect to a perpendicular to a plane of an upper surface of the substrate. The method further includes rotating the substrate about the perpendicular to the plane while the sidewall is treated with the ion beam to impact an entire height of the sidewall with the ion beam.

In another example embodiment, a method for forming a semiconductor device may include providing a set of surface features extending approximately perpendicularly from an upper surface of a substrate, each of the set of surface features including a sidewall. The method may further include treating the sidewall with an ion beam disposed at an angle, the angle being a non-zero angle of inclination with respect to the sidewall. The method may further include rotating the substrate about an axis parallel to the sidewall as the sidewall is treated with the ion beam, wherein an entire height of the sidewall is impacted with the angled ion beam.

In another example embodiment, a method for forming a semiconductor device may include providing a set of surface features extending from a substrate, each of the set of surface features including a sidewall. The method may further include treating the sidewall with an ion beam disposed at an angle, the angle being a non-zero angle of inclination with respect to a perpendicular to a plane of an upper surface of the substrate. The method may further include rotating the substrate about the perpendicular to the plane while the sidewall is treated with the angled ion beam. At a first rotation angle of the substrate the ion beam does not impact the entire height of the sidewall. At a second rotation angle of the substrate the ion beam impacts approximately the entire height of the sidewall, wherein the angle of the ion beam with respect to the perpendicular to the plane of the upper surface of the substrate is constant in the first and second rotation angles of the substrate.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional

DETAILED DESCRIPTION

Methods in accordance with the present disclosure will now be described more fully hereinafter with reference to the accompanying drawings, where embodiments of the methods are shown. The method may be embodied in many different forms and are not to be construed as being limited to the embodiments set forth herein. Instead, these embodiments are provided so this disclosure will be thorough and complete, and will fully convey the scope of the system and method to those skilled in the art.

As further described herein, provided are approaches for controlling the ion beam angle in the ion source platform and the process chamber without changing any ion source settings. Approaches herein provide a uniform ion flux from top to bottom across the entire vertical sidewall of the surface feature regardless of the device aspect ratio and without changing any ion source settings. This method uses a single precise mechanical control to achieve an intended rotational angle to avoid the approximation angle control of the prior art approaches, the prior art approaches controlling ion angles as a result of modifying a combination of multiple parameters.

More specifically, to achieve multiple ion beam angles for processing sidewall surfaces vertical or near vertical to a wafer plane, current art schemes tune multiple controls including extraction voltage, source RF power and optics-platen distance. These controls are interdependent and compromises have to be made to achieve optimum process conditions. Furthermore, changes to any of these parameters result in changes to process outputs including: ion beam current, source pressure, radical to ion ratio and dose. Also, due to the complexity and potential sacrifice to other properties, a limited number of beam angles are used in practice.

In contrast, approaches herein use a single control of platen rotation angle to modulate ion beam angle without modifying ion source operation or any other process control. The maximum ion beam angle may be set in the usual manner using extraction voltage, source power, z-gap and extraction optics design. The ion source and all other tool operation parameters, with the exception of wafer rotation, are held constant through the entire procedure. To change the effective angle incident on the surface of the side wall, the wafer is precisely rotated to a calculated angle by the roplat/platen. As will be explained in greater detail below, rotation of the wafer while the sidewall is treated with an angled ion beam permits the ion beam to impact an entire height of the sidewall.

Embodiments of the present disclosure advantageously enable single, independent control instead of a complicated compromise of multiple controls. More specifically, the platen rotation is independent from plasma source, electric and geometric controls. Other controls are not modified to achieve the same effect.

Embodiments of the present disclosure provide finer and predictable angle control. For example, the platen can be precisely rotated at 1-degree resolution, much more accurate and controllable than a combination of parameters. The finer angle resolution may satisfy different sidewall processing parameters, such as different profiles and doses. The rotation of the platen does not change the electoral and geometric configuration between the source and wafer. The beam angle can be precisely predicted by measuring the fixed initial angle and then calculating analytically. With an analytical model, a better controlled receipt can be generated with optimization methods.

Embodiments of the present disclosure provide a fixed source platen distance (gap) through the whole process, allowing optimization of other factors such as neutral gas flow, the neutral gas flow depending mainly on the gap. A constant gap allows a constant and predictable gas flow pattern/pressure, thus improving the evenness of the process. With respect to plasma profile, the gap partially dictates the plasma incident angle. A fixed gap allows a single calculation of the plasma angle, and more room for optimization of other plasma source parameters.

Embodiments of the present disclosure provide a fixed extraction voltage. Because the beam angle control is free from extraction voltage, the beam angle can be kept constant for the whole procedure. As a result, the plasma profile now can be optimized for a single electrical and geometric configuration, allowing for more aggressive optimization to achieve better beam properties.

Embodiments of the present disclosure simplify the scanning structure. A single rotation can satisfy the beam angle parameter. Current art schemes use multiple parameters to control the beam angle, including parameters implemented by the platen, such as distance, rotation angle, voltages, etc. Using the approaches herein, the complexity of the platen structure can be greatly reduced or even redesigned.

Figure 1:
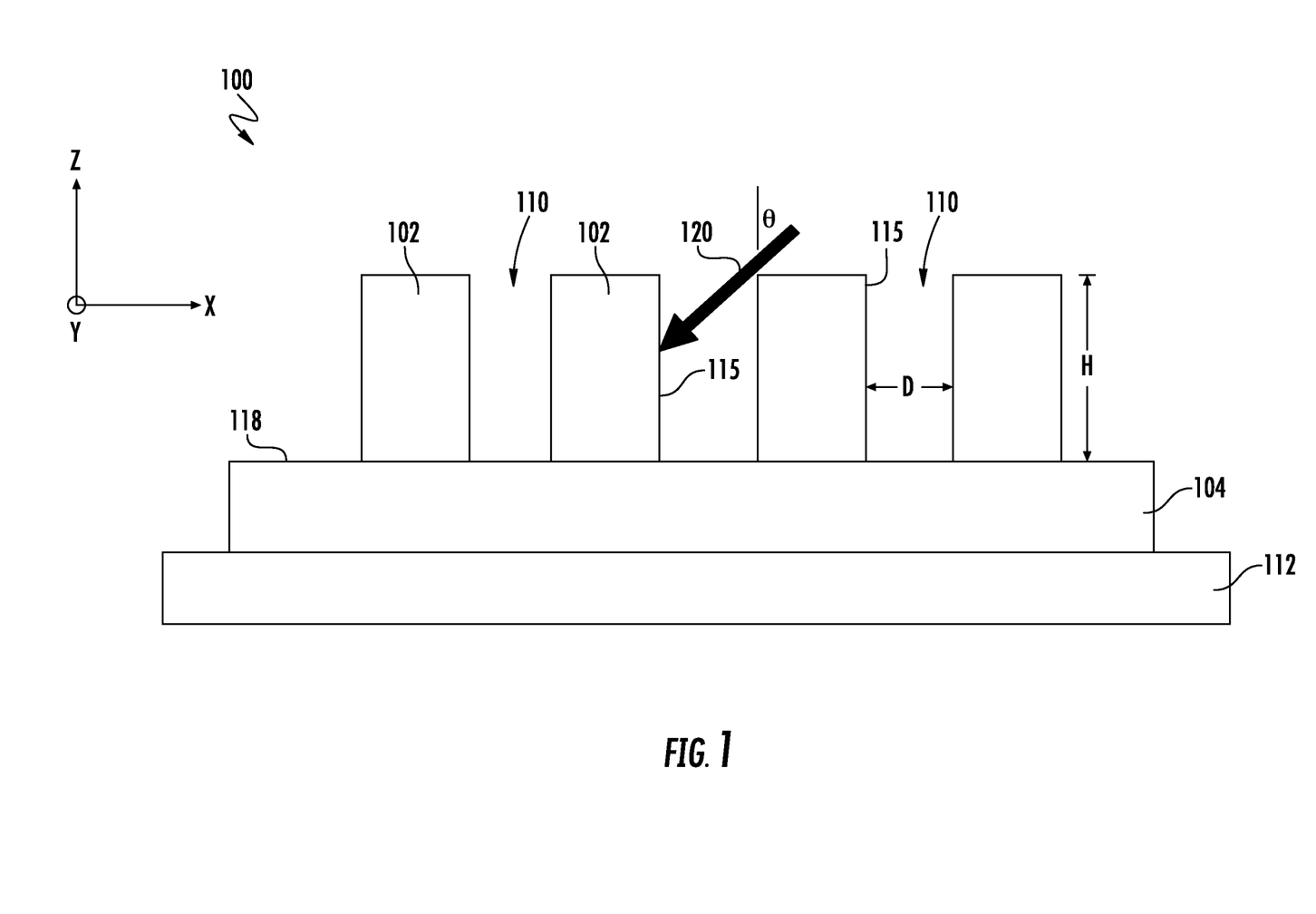
FIG. 1 depicts a side cross-sectional view of an approach for treating a set of surface features of a semiconductor device with an ion beam, in accordance with embodiments of the present disclosure.

Turning now to FIG. 1 there is shown a cross-sectional view of an approach for patterning a device 100 according to various embodiments of the disclosure. In FIG. 1, a set of (i.e., one or more) surface features 102 is disposed upon or is formed from a wafer or substrate 104. In various embodiments, the substrate 104 may include multiple layers, wherein the set of surface features 102 may be formed from a photoresist. Furthermore, the set of surface features 102 define a set of recesses or openings 110, as shown.

In various embodiments, the set of surface features 102 may form part of a larger pattern of features disposed on a silicon wafer or other substrate. Accordingly, the set of surface features 102 may be characteristic of many other similar features disposed on the substrate 104, such as millions of other similar features.

The substrate 104 may be arranged on a platen 112 in a process chamber (not shown). The platen 112 may use electrostatic clamping, mechanical clamping, differential vacuum clamping, gravity (no active clamping) or a combination of two or more of these types of clamping to retain the substrate 104. The substrate 104 may be scanned using the platen 112. The platen 112 may perform either 1D, 2D, or 3D scanning or rotation depending on the desired implant pattern on the substrate 104.

In this embodiment, the surface features 102 may have a uniform height 'H' across the wafer, as well as a uniform distance 'D' between adjacent surface features. Each of the surface features 102 includes a sidewall 115 extending perpendicularly from a plane (e.g., x-z plane) defined by an upper surface 118 of substrate.

As further shown in FIG. 1, the sidewall(s) 115 is treated with an ion beam 120 disposed at an angle θ. In some embodiments, the angle θ is a non-zero angle of inclination with respect to a perpendicular to the plane of the upper surface 118 of the substrate 104. Stated another way, the angle θ is measured with respect to a plane (e.g., y-z plane) defined by the sidewall 115 of the surface features 102. The term "at an angle" unless otherwise noted, may also denote a single angle or a range of angles at least some of some of the angles being non-perpendicular to a plane of the substrate 104 being impacted. Thus, when ions are provided to a substrate "at an angle" the ions may be provided over a range of angles including positive and negative angles with respect to a perpendicular, and are effective to strike or impact the sidewall 115.

Figure 2A:
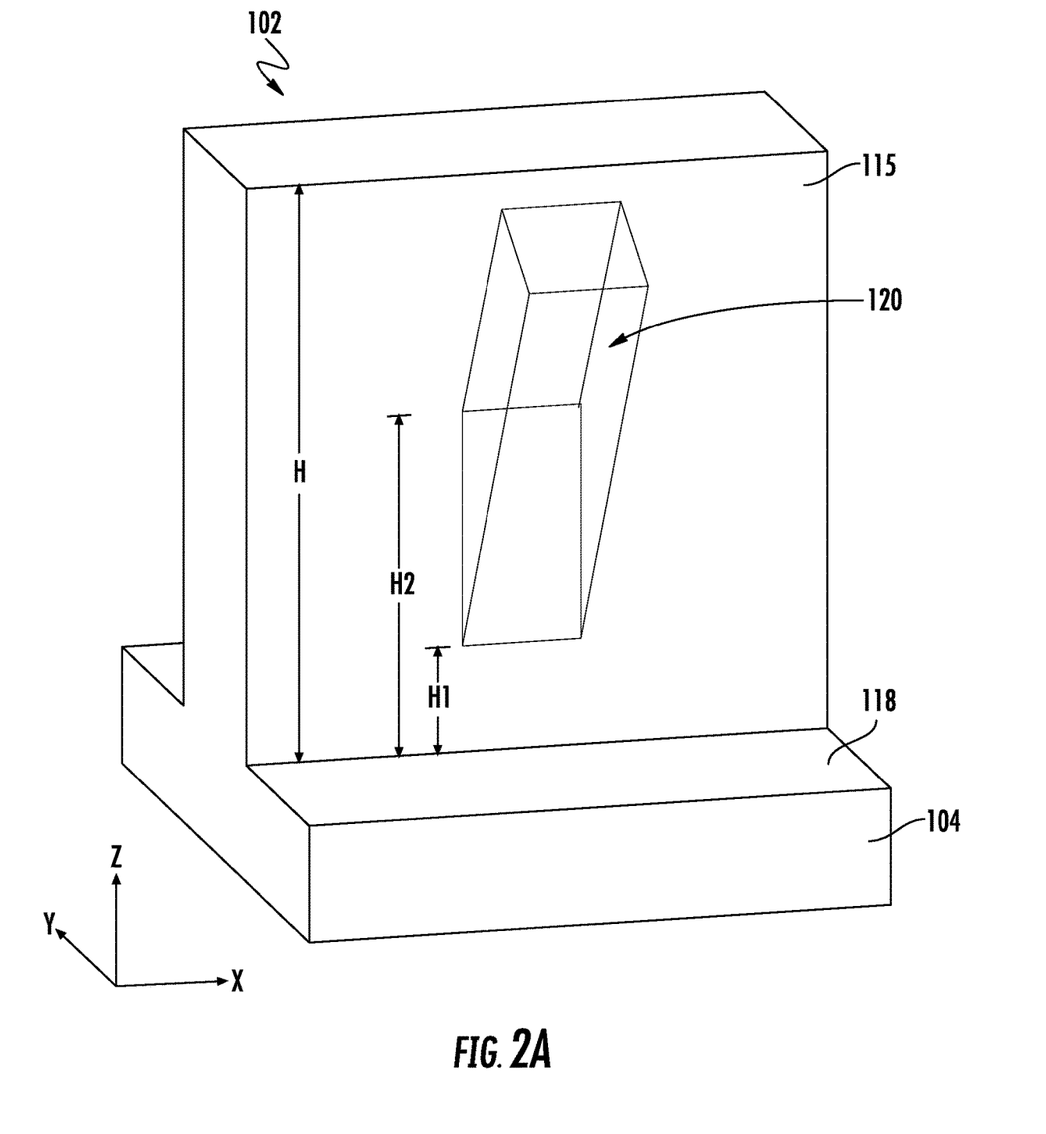
FIG. 2A is a perspective view of an example surface feature impacted by an ion beam when the substrate is in a first rotational position, in accordance with embodiments of the present disclosure.
Figure 2B:
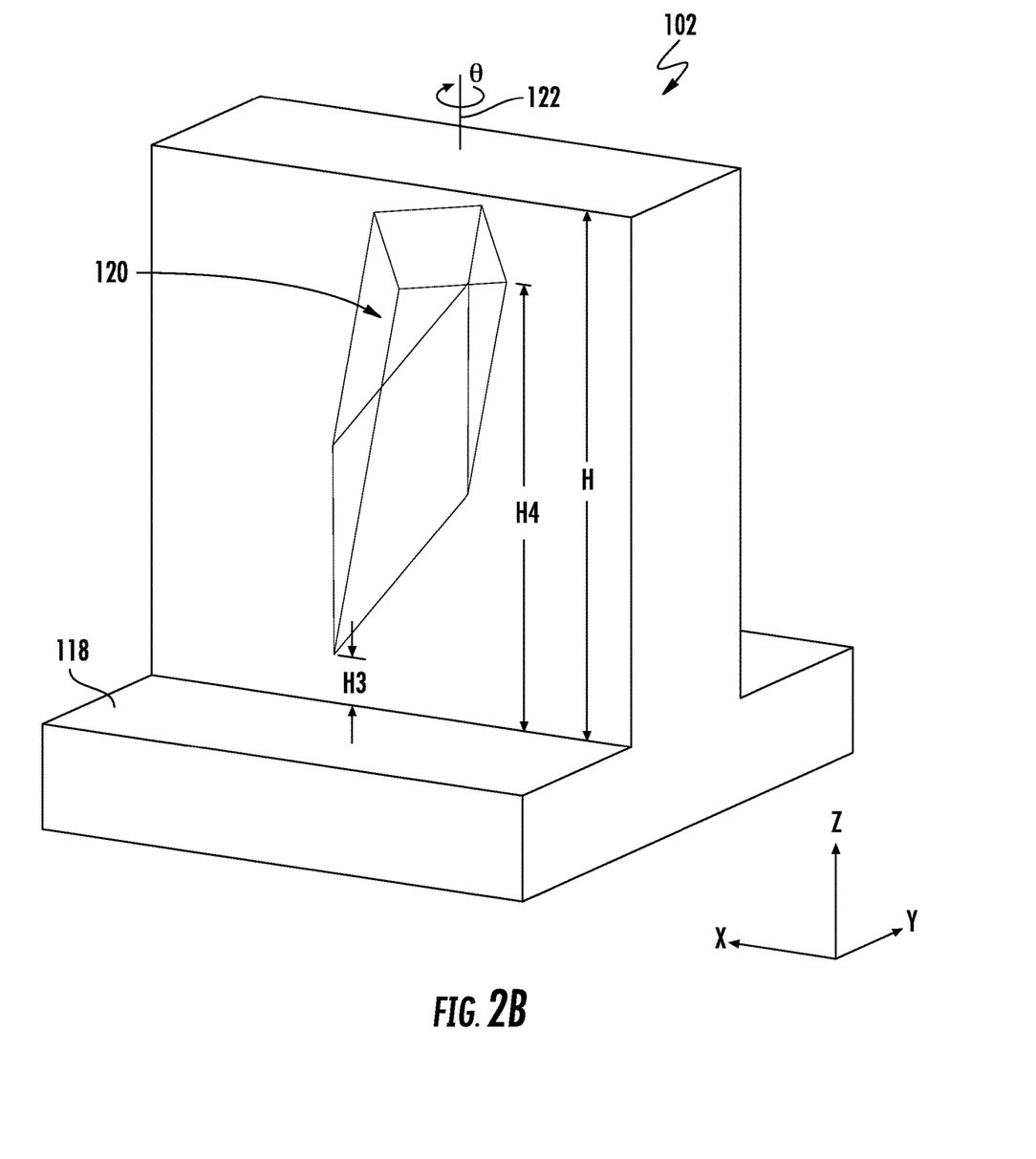
FIG. 2B is a perspective view of the example surface feature of FIG. 2A impacted by an ion beam when the substrate is in a second rotational position, in accordance with embodiments of the present disclosure.

Turning now to FIGS. 2A-2B, processing of the sidewall 115 of a representative surface feature 102 with the ion beam 120 according to embodiments of the present disclosure will be described in greater detail. During operation, processing may include directing the ion beam 120 into the sidewall 115 to form a treated layer there along. In other embodiments, the ion beam 120 may be directed at the sidewall 115 as part of an ion etch process. Processing may be performed while the device surface feature 102 is in a first rotational position, for example as shown in FIG. 2A. The ion beam 120 may impact a portion of the sidewall 115 between a first height, H1 and a second height, H2. As shown, H1 and H2 may be measured from the upper surface 118 of the substrate 104. At the first rotation angle shown (e.g., 90°), the ion beam 120 does not impact the entire height H of the sidewall 115.

As demonstrated in FIG. 2B, the surface feature 102 may then be rotated to a second rotational position while the ion beam 120 is processing the sidewall 115. Alternatively, the ion beam 120 may stop prior to rotation of the substrate 104, and resume when the surface feature 102 is brought to the second rotational position. As shown, the substrate 104 may rotate about a perpendicular 122 to the plane of the upper surface 118 by a second rotation angle, φ. Although non-limiting, φ may be 45°.

In the second rotational position shown in FIG. 2B, the ion beam 120 may impact a larger portion of the sidewall 115, for example, between a third height, H3 and a fourth height, H4. As the substrate continues to rotate about the perpendicular 122, the difference between H4 and H3 increases until the ion beam 120 impacts approximately the entire height H of the sidewall 115. In some embodiments, rotation of the substrate 104 and processing by the ion beam 120 stops when H3 is approximately zero (0) to prevent the ion beam 120 from impacting the upper surface 118 of the substrate 104. In other embodiments, rotation continues past the point where H3=0, and thus the ion beam 120 continues onto the upper surface 118 for implanting or etching.

As the substrate 104 is rotated between the first and second rotational positions shown in FIGS. 2A-2B, respectively, the non-zero angle of inclination of the ion beam 120 with respect to the perpendicular 122 remains fixed. More specifically, the ion beam 120 has the same beam angle relative to the ion source while the substrate rotates between two different orientations. FIG. 2A shows substrate rotation of 90° so the long axis (e.g., z-axis) of the sidewall 115 is parallel to the long axis of the plasma extraction aperture (not shown) positioned above the sidewall 115 in this orientation. The mean beam angle (30° in this example) is measured relative to the normal to the extraction aperture. FIG. 2B shows the beam 120 for the same conditions as in FIG. 2A, except the sidewall 115 is rotated 45° relative to the ion source extraction aperture.

Furthermore, a voltage used to generate and/or deliver the ion beam 120 may remain constant between the first and second rotational positions. In other words, the angled ion beam 120 and rotation of the substrate 104 provides a uniform ion flux from top to bottom across the entire vertical height H of the sidewall 115 without changing any ion source settings and regardless of the device aspect ratio. This approach achieves continuous beam angle control.

Figure 3:
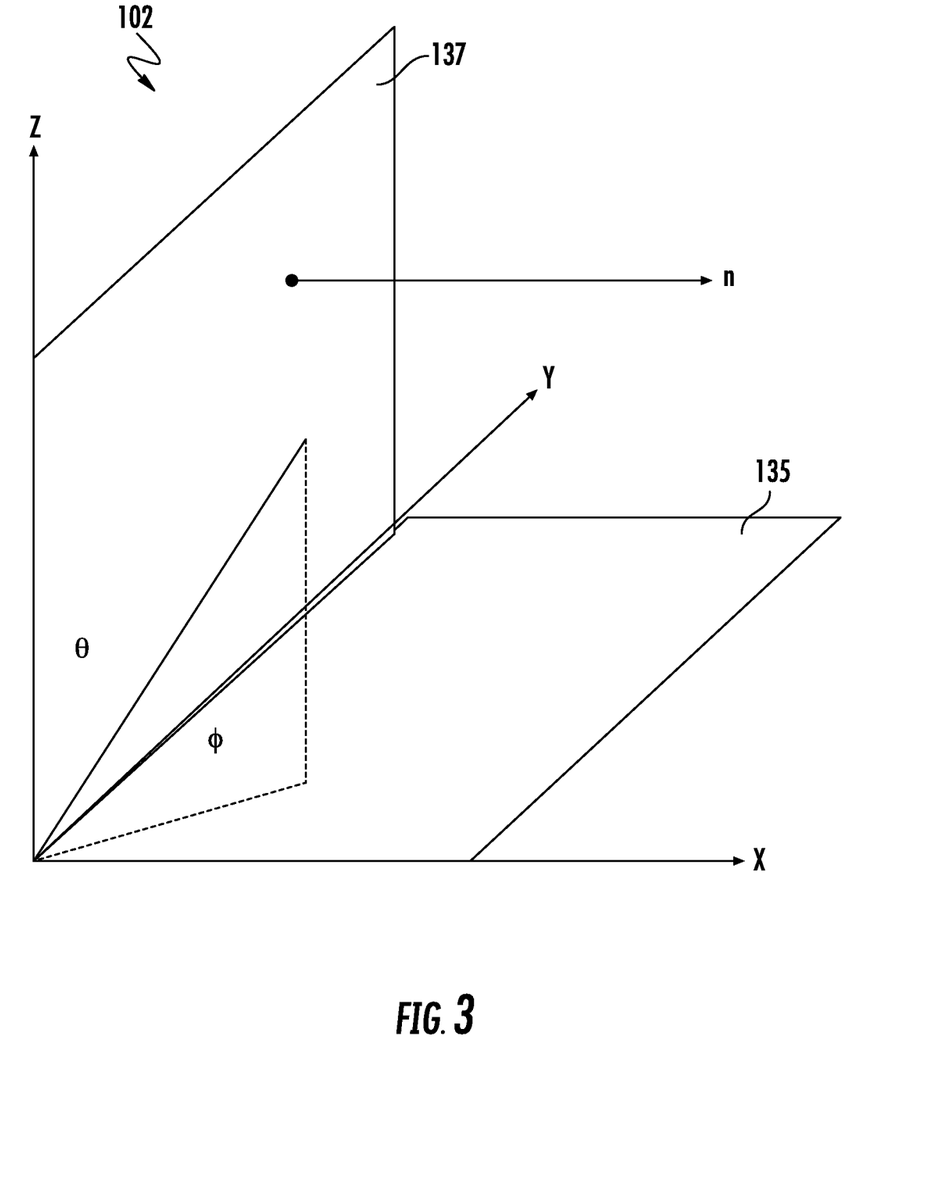
FIG. 3 depicts one approach for determining an effective angle of an ion beam, in accordance with embodiments of the present disclosure.

Referring now to FIG. 3, calculation of an effective angle of an ion beam incident on the surface of the sidewall according to embodiments of the present disclosure will be described in greater detail. As shown, an example surface feature 102 is represented by two planes, namely the x-y plane 135 (e.g., plane of the upper surface of the substrate) and the y-z plane 137 (e.g., plane of the sidewall of the surface features). Also shown are two angles, namely the zenith angle θ (e.g., the ribbon ion beam angle) and the azimuth angle φ (e.g., the wafer rotation or wafer twist angle). For this geometric structure, the unit vector η is in the direction normal to the side wall, so:

$$\eta=(1,0,0)$$

The ion beam direction is:

$$v_b=(\sin\theta\sin\phi,\sin\theta\cos\phi,-\cos\theta)$$

For the case φ=90°:

$$v_b=(\sin\theta,0,-\cos\theta).$$

The inner product of these two vectors is defined as:

$$\eta\cdot v_b=\Sigma\eta_i v_{b_i}=|\eta||v_b|\cos\alpha,$$

where α is the angle between the two vectors η and v. Now, for φ=90°, $$\eta\cdot vb=\sin\theta=|\eta||vb|\cos\alpha=\cos\alpha.$$

Therefore α=90−θ.
For the case φ≠90°:

$$vb'=(\sin\theta\sin\phi,\sin\theta\cos\phi,-\cos\theta)$$

The inner product of these two vectors is defined as:

$$\eta\cdot v'b=\Sigma niv'bi=|\eta||v'b|\cos\alpha'.$$

Therefore, η·v'b=sin θ sin φ=cos α'=sin θ', and θ'=a sin(sin θ sin φ), wherein θ' is the effective angle, or the angle the ion beam incident on the sidewall of the feature in response to the angle of rotation of the substrate.

Figure 4:
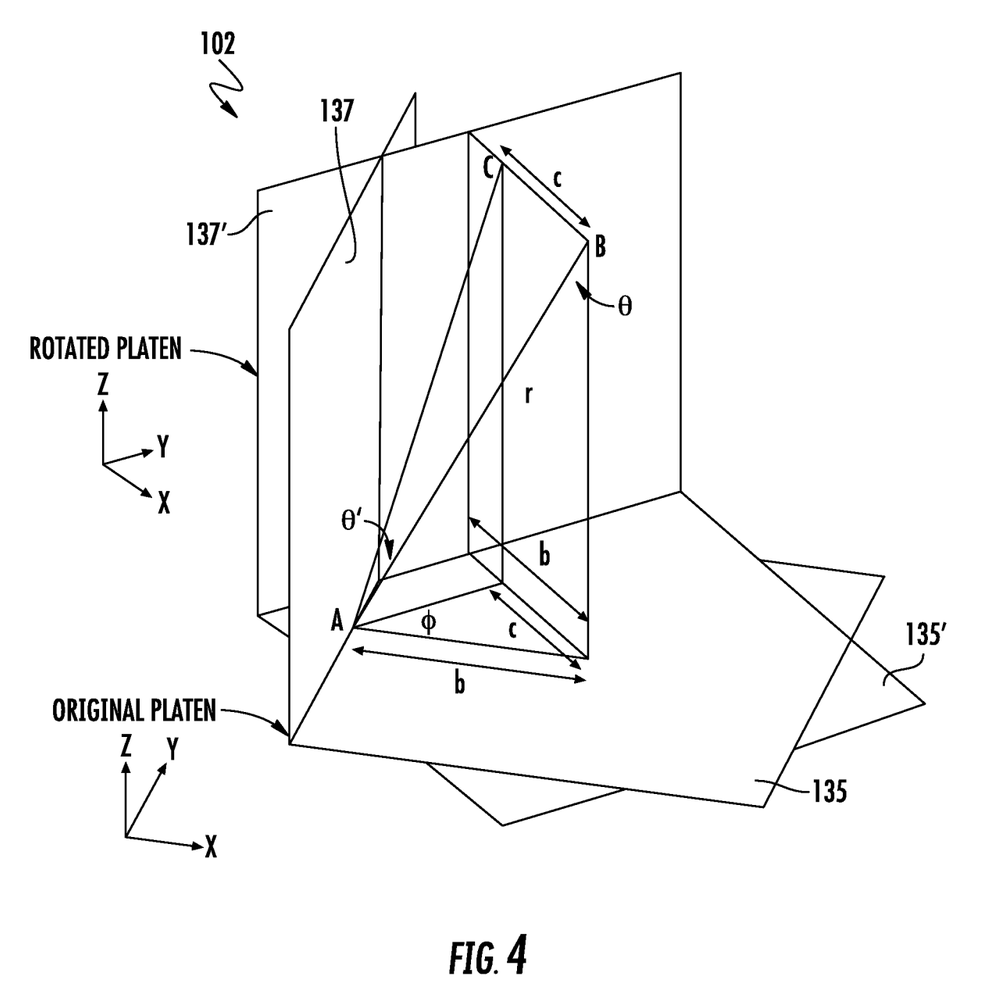
FIG. 4 depicts one approach for determining an effective angle of an ion beam, in accordance with embodiments of the present disclosure.

Referring now to FIG. 4, calculation of the effective angle according to another embodiment of the present disclosure will be described in greater detail. As shown, the example surface feature 102 in an original platen position is represented by two planes, namely the x-y plane 135 (e.g., plane of the upper surface of the substrate) and the y-z plane 137 (e.g., plane of the sidewall of the surface features). The surface feature 102 in a second, rotated platen position is similarly represented by x-y plane 135' and y-z plane 137'. In this embodiment, $$\theta=\arcsin\frac{b}{r}$$

$$\theta'=\arcsin\frac{c}{r}$$

$$c=b\sin\phi$$

Figure 5:
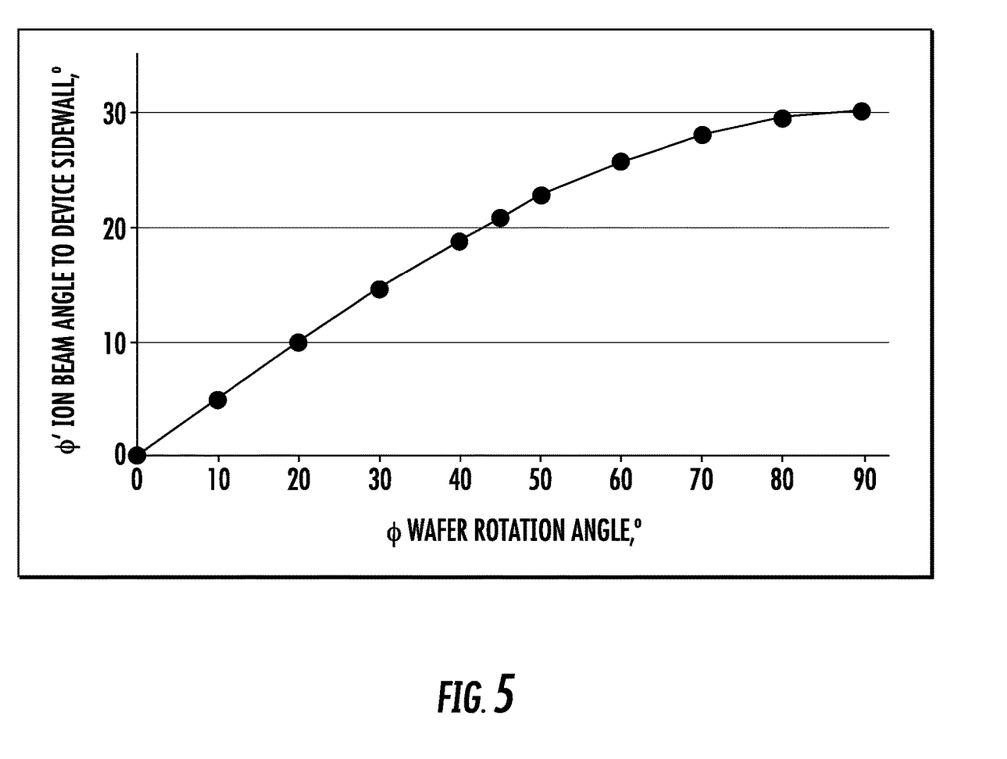
FIG. 5 is a graph depicting the effective angle between the ion beam and a surface feature sidewall as a function of the wafer rotation angle.

Therefore, θ'=arcsin (sin θ$_0$ sin φ). When φ is 90°, the incident angle reaches the maximum value θ. When φ decreases from 90 to 0 degrees, the incident angle is reduced from θ to 0. FIG. 5 further shows the effective angle between the ion beam and the sidewall, θ', as a function of the wafer rotation angle, φ.

Figure 6:
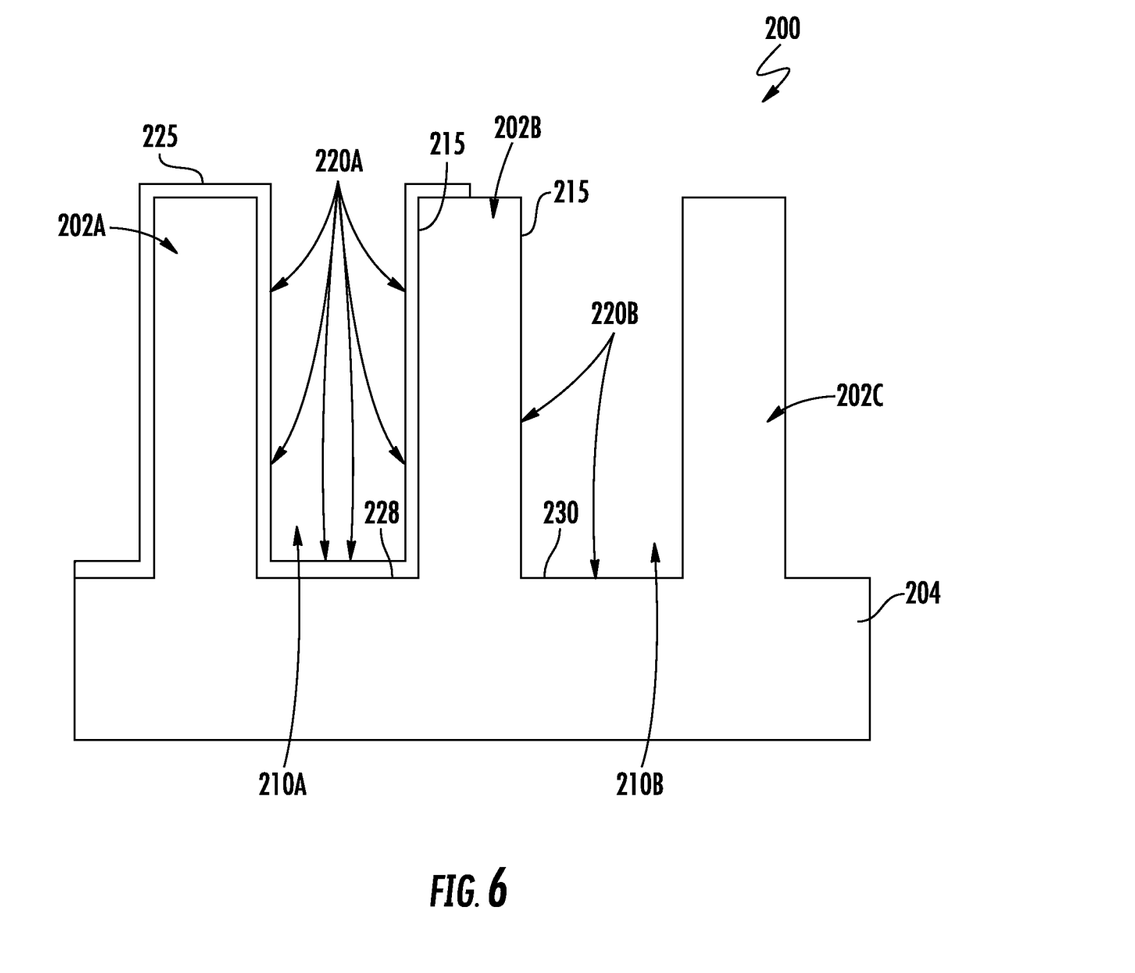
FIG. 6 depicts a side cross-sectional view of an approach for treating a set of surface features of a semiconductor device with an ion beam, in accordance with embodiments of the present disclosure.

Turning now to FIG. 6, processing of a semiconductor device (hereinafter "device") 200 according to embodiments of the present disclosure will be described in greater detail. As shown, the device 200 includes a plurality of surface features 202A-202C extending or formed from a substrate 204. Each of the surface features 202A-202C includes a sidewall 215. Between the surface features 202A and 202B is a first trench 210A. Between the surface features 202B and 202C is a second trench 210B. As shown, the first trench 210A may be subject to a first treatment, such as an angled ion implant 220A to a layer 225 along the sidewall 215 of surface features 202A and 202B, as well as along a base 228 of the first trench 210A. Using the approaches described above, including providing a fixed angle ion implant 220A together with rotation of the substrate 204 (e.g., by 90°), permits angled ion implant 220A to be performed at a constant ion flux and voltage. In one non-limiting embodiment, the surface treatment from ion implant 220A may be Rs reduction for ALD TiN.

As further shown, the second trench 210B may be subject to a second treatment, such as an angled ion etch 220B to remove one or more layers from along the sidewalls 215 of the surface features 202B and 202C, as well as along a base 230 of the second trench 210B. Using the approaches described above, including providing the fixed angle ion etch 220B together with rotation of the substrate 204, permits uniform etching along the entire height of the sidewall(s) 215. In some embodiments, the angled ion etch 220B also etches the base 230 between the surface features 202B and 202C. As a result, problems caused by beam shadowing in the etching of high aspect ratio structures, namely, unetched residual footing on the vertical sidewall, and unetched base at the bottom of the vertical side wall, can be eliminated. The etch approaches herein may also be used for spacer removal.

Figure 7:
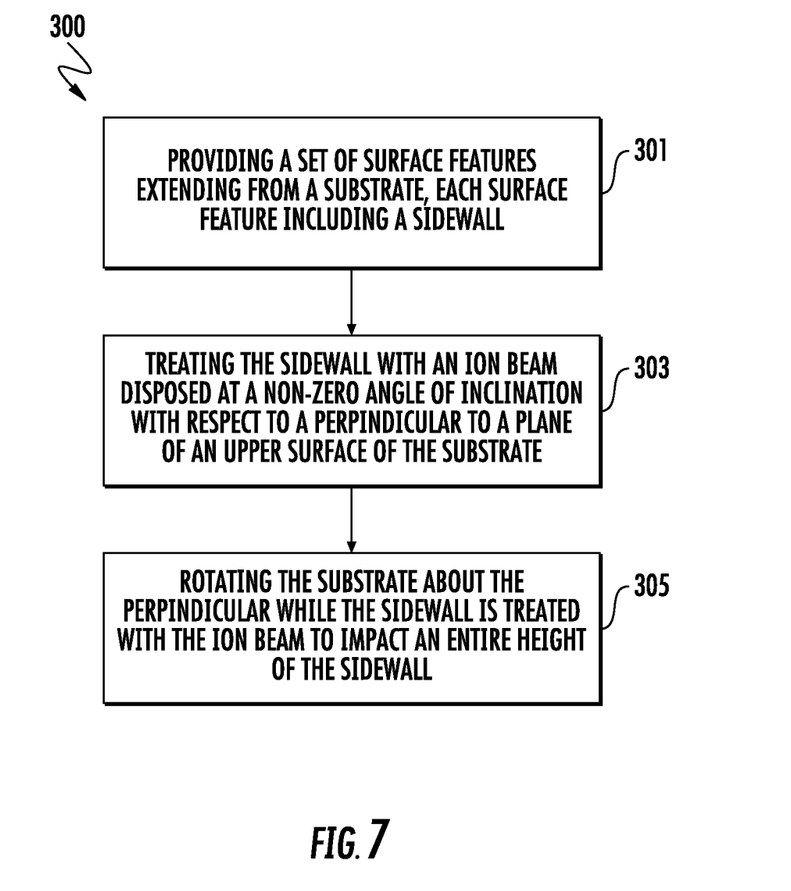
FIG. 7 is a flowchart illustrating an exemplary method according to the present disclosure.

Referring now to FIG. 7, a flow diagram illustrating an exemplary method 300 for forming a semiconductor device in accordance with the present disclosure is shown. The method 300 may be described in conjunction with the representations shown in FIGS. 1-6.

At block 301, the method 300 may include providing a set of surface features extending from a substrate, each of the set of surface features including a sidewall. In some embodiments, the sidewall is a vertical sidewall extending perpendicularly from an upper surface of the substrate. In some embodiments, the sidewalls define trenches between each of the set of surface features.

At block 303, the method 300 may include treating the sidewall with an ion beam disposed at an angle. The angle may have a non-zero angle of inclination with respect to a perpendicular to a plane along the upper surface of the substrate. In some embodiments, the treatment to the sidewall is an angled ion implant. In some embodiments, the treatment to the sidewall is an angled ion etch.

At block 305, the method 300 may include rotating the substrate about the perpendicular to the plane while the sidewall is being treated with the ion beam to impact an entire height of the sidewall with the ion beam. In some embodiments, at a first rotation angle of the substrate the ion beam may not impact the entire height of the sidewall. At a second rotation angle of the substrate the ion beam may impact approximately the entire height of the sidewall. As a result, the entire height of the sidewall may be etched as a result of the ion beam. In some embodiments, the upper surface may also be etched between two or more surfaces features. The angle of the ion beam with respect to the perpendicular to the plane of the upper surface of the substrate may remain constant in the first and second rotation angles of the substrate. Furthermore, in some embodiments, the ion beam may be generated and/or maintained at a fixed voltage during the treatment of the sidewall in the first rotational position and the second rotational position. In some embodiments, block 305 provides a uniform ion flux from top to bottom across the entire vertical sidewall of the surface feature regardless of the device aspect ratio and without changing any ion source settings.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. Various features of the certain aspects, embodiments, or configurations of the disclosure may be combined in alternate aspects, embodiments, or configurations. Moreover, the following claims are hereby incorporated into this Detailed Description by this reference, with each claim standing alone as a separate embodiment of the present disclosure.

As used herein, an element or step recited in the singular and proceeded with the word "a" or "an" is understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions and are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, identification references (e.g., primary, secondary, first, second, third, fourth, etc.) are not intended to connote importance or priority, and are used to distinguish one feature from another. The drawings are for purposes of illustration, and the dimensions, positions, order and relative sizes reflected in the drawings attached hereto may vary.

Furthermore, the terms "substantial" or "approximately," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, although the illustrative method 300 is described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be necessary to implement a methodology in accordance with the present disclosure. Furthermore, the method 300 may be implemented in association with the formation and/or processing of structures illustrated and described herein as well as in association with other structures not illustrated.

In view of the foregoing, at least the following technical benefits and advantages are achieved by the embodiments disclosed herein. Firstly, a single, independent control (i.e., substrate rotation) of the present embodiments replaces a complicated compromise of multiple controls, such as extraction voltage, source power, and z-gap. Secondly, rotation of the substrate permits much finer and predictable beam angle control. Thirdly, a fixed source platen distance through the whole process allows optimizations of other factors such as neutral gas flow and plasma profile. Fourthly, a fixed extraction voltage allows for more aggressive optimization of beam properties. Fifthly, the potential to simplify the scanning structure improves throughput and handling of the wafer.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method for forming a semiconductor device, the method comprising:
    providing a set of surface features extending from a substrate, the set of surface features including a sidewall;
    treating the sidewall with an ion beam disposed at an angle, the angle being a non-zero angle of inclination with respect to a perpendicular to a plane of an upper surface of the substrate, wherein the ion beam impacts just a portion of the sidewall;
    rotating the substrate about the perpendicular to the plane of the upper surface of the substrate; and
    treating the sidewall with the ion beam, wherein the ion beam impacts an entire height of the sidewall with the ion beam.

2. The method according to claim 1, further comprising providing a uniform ion flux along the entire height of the sidewall.

3. The method according to claim 1, further comprising maintaining the ion beam at a fixed voltage during treatment of the sidewall.

4. The method according to claim 1, wherein the angle of the ion beam is fixed during treatment of the sidewall.

5. The method according to claim 1, further comprising forming a treated layer along the sidewall.

6. The method according to claim 1, further comprising etching the sidewall.

7. The method according to claim 1, further comprising etching the entire height of the sidewall.

8. The method according to claim 1, further comprising etching the entire height of the sidewall and the upper surface of the substrate, wherein the upper surface is etched between two or more surface features of the set of surface features.

9. A method for treating a semiconductor device, the method comprising:
    providing a set of surface features extending approximately perpendicularly from an upper surface of a substrate, the set of surface features including a sidewall;
    treating the sidewall with an ion beam disposed at an angle, the angle being a non-zero angle of inclination with respect to the sidewall, wherein the ion beam impacts just a portion of the sidewall, the portion extending between a first point at a first height and a second point at a second height, wherein the first and second heights are measured from the upper surface of the substrate;
    rotating the substrate about an axis extending through the set of surface features, the axis being parallel to the sidewall; and
    treating the sidewall with the ion beam, wherein the ion beam is disposed at the angle, and wherein an entire height of the sidewall is impacted with the ion beam.

10. The method according to claim 9, further comprising providing the ion beam to the sidewall with a uniform ion flux along the entire height of the sidewall.

11. The method according to claim 9, further comprising maintaining the ion beam at a fixed voltage and at a fixed angle during treatment of the sidewall.

12. The method according to claim 9, further comprising forming a treated layer along the sidewall.

13. The method according to claim 9, further comprising etching the entire height of the sidewall and the upper surface of the substrate, wherein the upper surface is etched between two or more surface features of the set of surface features.

14. A method for processing a semiconductor device, the method comprising:
    providing a set of surface features extending from a substrate, the set of surface features including a sidewall;
    treating the sidewall with an ion beam disposed at an angle, the angle being a non-zero angle of inclination with respect to a perpendicular to a plane of an upper surface of the substrate; and
    rotating the substrate about the perpendicular to the plane while the sidewall is treated with the angled ion beam, wherein at a first rotation angle of the substrate about the perpendicular to the plane the ion beam impacts just a portion of the entire height of the sidewall, wherein at a second rotation angle of the substrate about the perpendicular to the plane the ion beam impacts approximately the entire height of the sidewall, and wherein the angle of the ion beam with respect to the perpendicular to the plane of the upper surface of the substrate is constant in the first and second rotation angles of the substrate.

15. The method according to claim 14, further comprising maintaining the ion beam at a fixed voltage during the treatment of the sidewall.

16. The method according to claim 14, further comprising forming a treated layer along the sidewall.

17. The method according to claim 14, further comprising etching the sidewall.

18. The method according to claim 14, further comprising etching the entire height of the sidewall.

19. The method according to claim 14, wherein each of the set of surface features has a uniform height.

20. The method according to claim 14, wherein a difference between the first rotation angle and the second rotation angle of the substrate is less than 90 degrees.

* * * * *